United States Patent [19]

Redfern

[11] Patent Number: 4,622,521

[45] Date of Patent: Nov. 11, 1986

[54] PRECISION OPERATIONAL AMPLIFIER USING DATA SAMPLING

[75] Inventor: Thomas P. Redfern, San Jose, Calif.

[73] Assignee: Linear Technology Corporation, Milpitas, Calif.

[21] Appl. No.: 812,016

[22] Filed: Dec. 23, 1985

[51] Int. Cl.[4] .......................... H03F 1/02; H03F 3/45
[52] U.S. Cl. ......................................... 330/9; 330/253
[58] Field of Search ................... 330/9, 253, 257, 261

[56] References Cited

PUBLICATIONS

Kash, "Building Quality Analog Circuits with C-MOS Logic Arrays", *Electronics*, vol. 54, No. 16, Aug. 11, 1981, pp. 109-112.

*Primary Examiner*—James B. Mullins
*Attorney, Agent, or Firm*—Flehr, Hohbach, Test, Albritton & Herbert

[57] ABSTRACT

Offsets in a chopper stabilized CMOS operational amplifier are nulled by adjusting the transconductance of the load transistors in the CMOS transistor pairs. This is accomplished by providing a small N channel transistor in parallel with each N channel load transistor of the CMOS pairs. A bias voltage is applied to the gate of one of the transistors and a voltage applied to the gate of the other N channel transistor. The voltage is developed by shorting the inputs to the operational amplifier and closing a feedback path around the input stage to null its offset. The nulling voltage taken at the gate of the other N channel transistor is capacitively stored and used during the subsequent sampling cycle.

4 Claims, 2 Drawing Figures

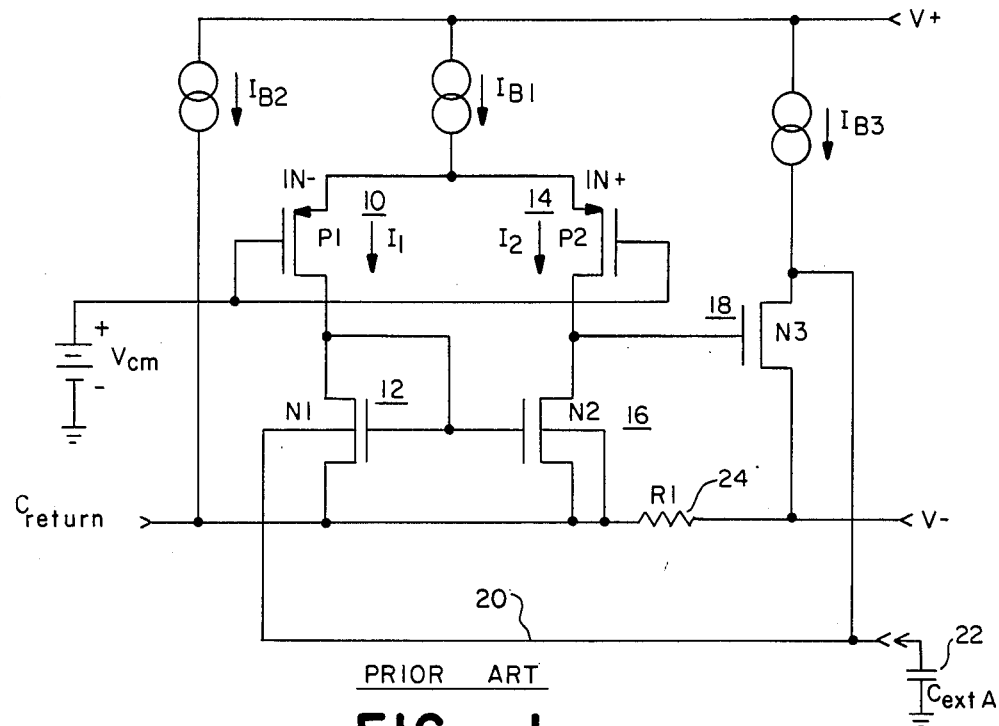
PRIOR ART
FIG.—1
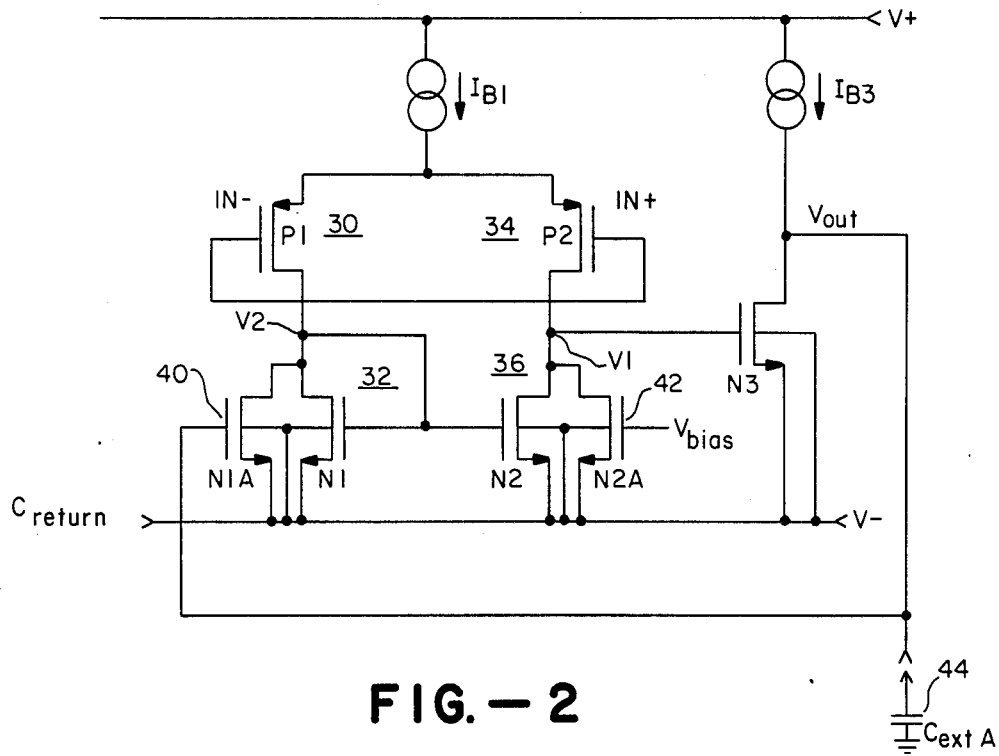
FIG.—2

PRECISION OPERATIONAL AMPLIFIER USING DATA SAMPLING

This invention relates generally to operational amplifiers, and more particularly the invention relates to an operational amplifier that utilizes data sampling to compensate for circuit offset.

The operational or differential amplifier provides an amplified output value based on the difference between two input signals. To ensure an accurate output signal offsets in the circuitry must be minimized or compensation must be provided. The conventional bipolar operational amplifier requires component matching to ensure an accurate output signal, while the conventional CMOS chopper stabilized operational amplifier provides a bias voltage to compensate circuit offset. In establishing the bias voltage, sampled data techniques are employed to periodically short the two inputs and closing a loop around the amplifier to force the output to zero. The resulting voltage on the load transistor is capacitively stored and provides a bias voltage during input sampling. The sampling is performed at a frequency much higher than the frequency of the input signals thereby providing essentially a continuous output.

However, the conventional CMOS chopper stabilized amplifier has several inherent problems. In order to accommodate positive and negative offsets, the sources of the N channel load transistors in each of the CMOS pair must be lifted above the negative supply voltage connected to the N channel transistors. Accordingly, a resistor is placed in series with the negative supply voltage which increases power consumption. Further, the second stage of the amplifier swings close to the negative supply voltage thus necessitating that the transistor current in the second stage be kept small. However, since this stage drives large external capacitors, the time required for the amplifier to reach a nutt state after power is first applied is extremely long. Likewise, overload recovery is very long.

Additionally, to minimize noise the areas of the N channel transistors are made large. The N channel transistors are typically fabricated in P- wells formed in an N- substrate, and the diode created therebetween can have a large leakage current at high temperatures which causes the holding capacitor to discharge. This capacitive discharge, in turn, can cause large offset errors.

Accordingly, an object of the present invention is an improved chopper stabilized CMOS differential amplifier.

A feature of the invention is the provision of transistors in parallel with the N channel load transistors in the first stage of a CMOS chopper stabilized amplifier.

Briefly, in a chopper stabilized amplifier employing first and second CMOS transistor pairs means is provided for biasing the amplifier including a first transistor in parallel with the load transistor of one CMOS pair and a second transistor in parallel with the load transistor of the other CMOS pair. Means is provided for applying a bias voltage to the gate of the second transistor, and capacitive means is provided for applying an offset correction voltage to the gate of the first transistor. The offset correction voltage is that value required to force the amplifier's output to zero when the inputs to said amplifier are shorted.

The invention and objects and features thereof will be more readily apparent from the following detailed description and appended claims when taken with the drawing.

FIG. 1 is an electrical schematic of a conventional CMOS chopper stabilized operational amplifier.

FIG. 2 is an electrical schematic of a CMOS chopper stabilized operational amplifier in accordance with one embodiment of the invention.

Referring now to FIG. 1, an electrical schematic is illustrated for a conventional CMOS chopper stabilized operational amplifier such as the Intersil ICL 7650. The amplifier comprises a first CMOS transistor pair including a P channel transistor 10 and an N channel load transistor 12. A second CMOS transistor pair includes a P channel transistor 14 and an N channel transistor 16. A positive voltage potential is applied to the sources of transistors 10 and 14, and a negative voltage potential is applied to the sources of the N channel load transistors 12 and 16. The negative input to the amplifier is applied to the gate of transistor 10, and the positive input to the amplifier is applied to the gate of transistor 14. The drain of transistor 12 is connected to the common gate connection between transistors 12 and 16, and the output of the transistor is taken at the drain of transistor 16 through an output transistor 18.

During the nulling portion of the cycle of a chopper stabilized amplifier, the inputs are shorted together and a feedback path 20 is closed around the input stage to null its offset. A capacitor 22 is provided as a sample and hold to store the nulling voltage for use during the sampling cycle. In the sampling cycle, feedback path 20 is opened, and the zeroed amplifier is used to amplify the differential input voltage. A continuous output results by switching between the nulling cycle and the sampling cycle at a frequency much higher than the signal frequency.

The circuit of FIG. 1 has a number of limitations. First, in order to accommodate positive and negative offsets the sources of transistors 12 and 16 must be lifted in voltage above the negative supply. This is accomplished by running a bias current through a resistor 24 connected between the sources and the negative voltage potential. However, resistor 24 increases the power consumption of the amplifier and necessitates the addition of the $C_{return}$ pin. The external holding capacitors must be returned to this point to keep the amplifier noise low.

Additionally, the output of the second stage taken at the drain of transistor 18 must swing close to the negative voltage potential. This necessitates the drain current being small and creates a large second stage offset term. Since transistor 18 drives large external capacitors, the time for the amplifier to reach a null state after power is first applied can be extremely long. Further, overload recovery time is also very long.

Finally, the area of the load transistors 12 and 16 must be made large in order to minimize noise. Accordingly, the body of the N channel load transistors, a P- well formed in a N- substrate, is very large in area. The diode formed between the P- well and the N- substrate is normally reverse biased and does not affect the operation of the amplifier. However, at high temperature the leakage of this diode causes the holding capacitor to discharge which in turn can cause large offset errors.

The limitations in the circuitry of FIG. 1 are overcome in the CMOS operational amplifier in accordance with the invention. FIG. 2 is an electrical schematic of one embodiment of an operational amplifier in accordance with the invention and again includes a first CMOS transistor pair including P channel transistor 30 and N channel load transistor 32 connected between a positive voltage potential and a negative voltage potential. A second CMOS transistor pair including P channel transistor 34 and N channel load transistor 36 are also connected between the positive and negative voltage potentials. The drain of transistor 32 is again connected to the connection of the gates of transistors 32 and 36, and the output of the amplifier is taken at the drain of transistor 36 through second stage transistor 38.

In accordance with the invention a first N channel transistor 40 is provided in parallel with transistor 32, and a second N channel transistor 42 is provided in parallel with load transistor 36. The transistors 40 and 42 can respectively be fabricated in the P- well of transistors 32 and 36. The gate of transistor 42 is connected to a bias voltage, and if the amplifier is perfectly balanced the gate of transistor 40 will be driven by the same voltage which is stored on the capacitor 44 during the nulling cycle. To accommodate mismatch errors, the nulling loop drives the gate of transistor 40 either above or below the bias voltage to null the amplifier. Transistors 40 and 42 have a small gm compared to transistors 32 and 36 and therefore do not contribute significant noise to the amplifier.

The bias voltage applied to the gate of transistor 42 is chosen to be approximately equal to the current mirror of the positive input stage (V2). Similarly, the current $I_{b3}$ and transistor 38 are chosen so that the output voltage is equal to the voltage $V_1$ at null. This minimizes the second stage offset term. The internal bias voltage consumes much less power than $I_{b2}$ in FIG. 1 and allows reduced power consumption.

Since the $C_{return}$ pin is tied directly to the negative voltage potential the external capacitors can be tied to this potential with no noise degradation and the $C_{return}$ pin can be eliminated.

The output of transistor 38 does not have to swing to the negative voltage potential, thus $I_{b3}$ can be set much higher, typically 100 times higher. This greatly improves power turnon settling and overload recovery times. Further, no large junctions are tied to capacitor 44 and thus superior temperature performance results due to minimum leakage current at high temperatures.

An improved chopper stabilized CMOS operational amplifier has been described which achieves improved performance over the conventional CMOS operational amplifier. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is;

1. In a chopper stabilized operational amplifier employing first and second CMOS transistor pairs, each transistor pair including a P channel transistor serially connected with an N channel load transistor, means for biasing said operational amplifier comprising a first N channel transistor in parallel with the load transistor of one CMOS pair and a second N channel transistor in parallel with the load transistor of the other CMOS pair, means for applying a bias voltage to the gate of said second transistor, and capacitive means for applying a voltage to the gate of said first transistor to compensate for offset in the amplifier, said charge being generated when the inputs of said operational amplifier are shorted and the output forced to zero.

2. The operational amplifier as defined by claim 1 wherein said first and second transistors have a smaller gm than that of said load transistors.

3. A chopper stabilized operational amplifier comprising a first CMOS transistor pair including a first P channel transistor that is serially connected with first N channel transistor, each transistor having a source contact, a gate contact, and a drain contact, a second CMOS transistor pair including a second P channel transistor and a serially connected second N channel transistor, each transistor having a source contact, a gate contact and a drain contact, means for applying a positive voltage potential to the source contacts of said first and second P channel transistors, means for applying a negative voltage potential to the source contacts of said first and second N channel transistors, means for applying a first input to the gate contact of said first P channel transistor, means for applying a second input to the gate contact of said second P channel transistor, means interconnecting the gate contacts of said first and second N channel transistors and the drain contacts of said first P channel transistor and said first N channel transistor, a third N channel transistor including means for connecting said third N channel transistor between said positive voltage potential and said negative voltage potential, and means connecting the drains of said second P channel transistor and said second N channel transistor to the gate of said third N channel transistor, capacitance means switchably connected to the drain of said third N channel transistor, a fourth N channel transistor connected in parallel with said first N channel transistor and a fifth N channel transistor connected in parallel with said second N channel transistor, means for applying a bias voltage to the gate of said fifth N channel transistor, and means for connecting said capacitance means to the gate of said fourth N channel transistor.

4. In a chopper stabilized operational amplifier including first and second CMOS transistor pairs, each pair having a P channel transistor and a serially connected N channel load transistor, a method of nulling offset in the amplifier comprising the steps of providing a first N channel transistor in parallel with one of said load transistors, providing a second N channel transistor in parallel with the other of said load transistors, applying a bias voltage to the gate of said first N channel transistor, and applying a voltage to the gate of said second N channel transistor, said voltage being generated when the output of said operational amplifier is forced to zero and the inputs to said operational amplifier are shorted.

* * * * *